(12) United States Patent
Shinohara et al.

(10) Patent No.: US 8,345,137 B2
(45) Date of Patent: Jan. 1, 2013

(54) SOLID-STATE IMAGE PICKUP APPARATUS AND CAMERA WITH TWO-DIMENSIONAL POWER SUPPLY WIRING

(75) Inventors: Mahito Shinohara, Tokyo (JP);
Masaaki Iwane, Sagamihara (JP);
Yukihiro Kuroda, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 287 days.

(21) Appl. No.: 12/671,043

(22) PCT Filed: Feb. 26, 2009

(86) PCT No.: PCT/JP2009/054099
§ 371 (c)(1),
(2), (4) Date: Jan. 28, 2010

(87) PCT Pub. No.: WO2009/107854
PCT Pub. Date: Sep. 3, 2009

(65) Prior Publication Data
US 2010/0194946 A1    Aug. 5, 2010

(30) Foreign Application Priority Data

Feb. 29, 2008  (JP) ................. 2008-049897

(51) Int. Cl.
*H04N 3/14*   (2006.01)
*H04N 5/335*  (2011.01)
(52) U.S. Cl. ...................... 348/308; 348/301
(58) Field of Classification Search .......... 348/300, 348/301, 302, 308; 250/208.1; 257/291, 257/292, 293, 294
See application file for complete search history.

(56) References Cited

U.S. PATENT DOCUMENTS

| | | | | |
|---|---|---|---|---|
| 5,955,753 | A | 9/1999 | Takahashi | 257/292 |
| 6,650,369 | B2 | 11/2003 | Koizumi et al. | 348/301 |
| 7,250,970 | B2 | 7/2007 | Shinohara | 348/308 |
| 7,372,491 | B2 | 5/2008 | Ohkawa | |

(Continued)

FOREIGN PATENT DOCUMENTS

EP    0 757 476 A2    2/1997
(Continued)

OTHER PUBLICATIONS

Notice of Reasons for Refusal issued Sep. 7, 2012, in Japanese Application No. 2008-049897.

*Primary Examiner* — Jason Whipkey
(74) *Attorney, Agent, or Firm* — Fitzpatrick, Cella, Harper & Scinto

(57) ABSTRACT

A solid-state image pickup apparatus includes a pixel area in which pixels each having at least a photoelectric conversion unit and an amplification transistor for amplifying and outputting a signal of the photoelectric conversion unit are two-dimensionally arranged in horizontal and vertical directions, wherein a power supply wiring, which extends in a vertical direction along pixel boundaries of horizontal and vertical directions while meandering, is arranged on one of two pixel lines adjoining to each other in the horizontal direction in the pixel area, and the power supply wiring is connected to one of a source and a drain of the amplification transistor on each of the two pixel lines. Thus, it is possible to provide a high-sensitivity and high-image-quality amplified solid-state image pickup apparatus in which a difference of sensitivities at one-line intervals is small.

13 Claims, 5 Drawing Sheets

U.S. PATENT DOCUMENTS

| | | |
|---|---|---|
| 7,394,492 B2 | 7/2008 | Shinohara .................... 348/301 |
| 7,935,995 B2 | 5/2011 | Watanabe et al. |
| 8,222,682 B2 | 7/2012 | Watanabe et al. |
| 2001/0013900 A1* | 8/2001 | Suzuki et al. ................. 348/302 |
| 2003/0137594 A1 | 7/2003 | Koizumi et al. ............. 348/308 |
| 2004/0132262 A1 | 7/2004 | Ayabe et al. |
| 2004/0141077 A1 | 7/2004 | Ohkawa ........................ 348/308 |
| 2004/0252212 A1 | 12/2004 | Ohkawa ........................ 348/308 |
| 2005/0253945 A1 | 11/2005 | Shinohara ....................... 348/30 |
| 2007/0064133 A1* | 3/2007 | Shizuishi ...................... 348/308 |
| 2007/0177044 A1 | 8/2007 | Maruyama et al. ........... 348/308 |
| 2008/0029787 A1 | 2/2008 | Watanabe et al. ............. 257/233 |
| 2008/0252764 A1 | 10/2008 | Shinohara ..................... 348/308 |
| 2008/0303930 A1 | 12/2008 | Kuroda et al. ................ 348/308 |
| 2009/0046186 A1* | 2/2009 | Nagai ............................ 348/301 |
| 2009/0200449 A1 | 8/2009 | Iwata et al. ................... 250/206 |
| 2009/0219420 A1 | 9/2009 | Kuroda ......................... 348/281 |
| 2009/0231478 A1 | 9/2009 | Shinohara ..................... 348/300 |
| 2010/0002117 A1 | 1/2010 | Iwane et al. .................. 348/308 |

FOREIGN PATENT DOCUMENTS

| | | |
|---|---|---|
| EP | 1 455 395 A2 | 9/2004 |
| JP | 9-046596 A | 2/1997 |
| JP | 11-097662 A | 4/1999 |
| JP | 11-112018 A | 4/1999 |
| JP | 2000-059697 A | 2/2000 |
| JP | 2000-101058 A | 4/2000 |
| JP | 2001-223350 A | 8/2001 |
| JP | 2003-230055 A | 8/2003 |
| JP | 2004-104203 A | 4/2004 |
| JP | 2004-274578 A | 9/2004 |
| JP | 2005-005573 A | 1/2005 |
| JP | 2006-253876 A | 9/2006 |
| JP | 2008-041689 A | 2/2008 |
| JP | 2008-085351 A | 4/2008 |

* cited by examiner

SOLID-STATE IMAGE PICKUP APPARATUS AND CAMERA WITH TWO-DIMENSIONAL POWER SUPPLY WIRING

TECHNICAL FIELD

The present invention relates to a solid-state image pickup apparatus and a camera. In particular, the present invention relates to an amplified solid-state image pickup apparatus and a camera which uses the amplified solid-state image pickup apparatus.

BACKGROUND ART

In recent years, a solid-state image pickup apparatus is approximately classified into a type of CCD (charge coupled device) and a type of amplified solid-state image pickup apparatus in which each pixel has a signal amplification function. More specifically, in various amplified solid-state image pickup apparatuses, a CMOS (complementary metal-oxide semiconductor) sensor has been rapidly in practical use because a technique of reducing noises of the CMOS sensor was developed and the CMOS sensor excellently matches with a CMOS process. As a result, the CMOS sensors and the CCDs come to substantially divide the whole of the various solid-state image pickup apparatuses in two.

However, since the number of transistors which constitute the pixels of the CMOS sensor is extremely large, numerous wirings for controlling these transistors are necessary, whereby a multi-layer wiring must be adopted. For this reason, in the reduced-size pixel, the height of the opening of the wiring from the surface of a photodiode is high, and further the area of the opening is narrow. As a result, there is a problem that sensitivity of the CMOS sensor degrades.

In order to solve the above-described problem of the CMOS sensor, there are several proposals which concern the constitution of the pixel. One of these proposals is disclosed in the patent document 1 (Japanese Patent Application Laid-Open No. H09-046596). More specifically, the patent document 1 discloses that plural photodiodes share transistors constituting a pixel so as to reduce the number of transistor elements for each pixel. Besides, another proposal is disclosed in the patent document 2 (Japanese Patent Application Laid-Open No. H11-112018). More specifically, the patent document 2 discloses that the use of transistors for selection is eliminated.

Further, another proposal is disclosed in the patent document 3 (Japanese Patent Application Laid-Open No. H11-097662). More specifically, FIGS. 2 and 4 of the patent document 3 respectively disclose pixel wirings. That is, in the patent document 3, a power supply wiring for an amplification transistor and a pixel output wiring are constituted as vertical lines extending in a column direction. Further, driving wirings to be connected to the gates of pixel transistors such as a transfer transistor, a reset transistor and the like are constituted as horizontal lines extending in a row direction. By constituting a pixel as above, an opening can be made wider as much as possible.

Under the circumstances, in order to further reduce the number of wirings in the pixel of the CMOS sensor, it is conceivable that the pixels of two lines share a single power supply line so that one power supply wiring is provided for the two pixels lines. In this connection, the patent document 4 (Japanese Patent Application Laid-Open No. 2003-230055) discloses in FIG. 15 and the corresponding description that pixels of two lines are set to be symmetrical in regard to the boundary thereof, and that a power supply line is provided on the relevant boundary. According to such a pixel constitution of a CMOS sensor, since the area of an opening of a wiring can be widened, sensitivity of the CMOS sensor can be improved.

However, it should be noted that the following problem concerning image quality occurs in the constitution disclosed in the patent document 4. More specifically, FIG. 6 illustrates a wiring layout in 2×2 pixels according to the constitution disclosed in the patent document 4. In FIG. 6, numeral 16 denotes one pixel frame, and the four pixel frames 16 are arranged in the form of 2×2. Besides, a power supply wiring 6, a left-line pixel output wiring 7-1, and a right-line pixel output wiring 7-2 are arranged.

As can be seen from FIG. 6, in the symmetrical two pixel lines, it is believed that the left-line pixel output wiring 7-1, the right-line pixel output wiring 7-2 and the power supply wiring 6 are arranged on the pixel boundary in the vertical direction of the two pixel lines. For this reason, since the center of the wiring opening is shifted to closer one of the right and left ends of the two pixel lines, sensitivity of the right-line pixels in regard to oblique incident light is different from sensitivity of the left-line pixels in regard to oblique incident light.

In other words, the left-line pixels tend to have higher sensitivity in regard to right oblique incident light as compared with left oblique incident light, while the right-line pixels tend to have higher sensitivity in regard to left oblique incident light as compared with right oblique incident light. The solid-state image pickup apparatus receives light sent from a condensing lens. Here, in the solid-state image pickup apparatus, with respect to the pixel receiving the light transmitting through the center line of the lens, the left oblique incident light and the right oblique incident light have the same weight. However, with respect to the pixel apart from the center line of the lens, for example, the pixel apart from the center line of the lens in the left direction, an amount of the oblique incident light from the right is larger as compared with an amount of the oblique incident light from the left. Consequently, at that position, the sensitivity of the left-line pixel is high but the sensitivity of the right-line pixel is low. For this reason, even if uniform incident light is irradiated onto such a portion, pixel outputs vary at one-line intervals. Here, it should be noted that the pixels positioned apart from the center line of the lens in the right direction show a tendency opposite to that of the pixels positioned in the left direction. Consequently, even if uniform incident light is irradiated onto the pixel area, a difference between the output of the left-line pixel and the output of the right-line pixel becomes large according to the pixels positioned closer to the end of the pixel area in the horizontal direction. As a result, image quality deteriorates.

One reason of such a problem is that the numbers of the wirings to be arranged on the boundaries of the pixel lines are "0", "3", "0", "3", ... in due order. Further, even if the pixel output wirings are arranged respectively at the left and right ends of the pixels of two pixel lines, the numbers of the wirings at the boundaries of the pixel lines are "2", "1", "2", "1", .... Thus, the wirings having the certain same number cannot be acquired at the boundaries of the respective lines, whereby the above problem cannot be solved. In addition, another reason of the above problem is that a photoelectric conversion unit itself formed on a semiconductor is symmetrical in regard to the boundary between the two pixel lines.

The above problem becomes more acute in case of a color image pickup apparatus. More specifically, an amplified solid-state image pickup apparatus often adopts a Bayer-arrangement color filter in which green pixels obliquely adjoin. In this case, a luminance signal of the sensor is controlled by a green-pixel signal. Here, even if the luminance of the light transmitted through a condensing lens is even throughout the pixel area as described above, a difference of the luminance signals at one-line intervals becomes large according to the pixel position closer to the end of the pixel area in the horizontal direction. As a result, image quality deteriorates.

Besides, in an image pickup apparatus which is applied to a color image pickup apparatus such as a three chips camera not adopting a color filter, a sensor signal is generally output by adding the signals of the above and below adjoining pixels through an interlacing operation. In such an example, both the centers of the openings of the above and below adjoining pixels are being shifted similarly in regard to the center of the pixel. For this reason, a difference of the added signals at one-line intervals becomes large according to the pixel position closer to the end of the pixel area in the horizontal direction. As a result, image quality deteriorates likewise.

DISCLOSURE OF THE INVENTION

A solid-state image pickup apparatus according to the present invention is characterized by comprising a pixel area in which pixels each having at least a photoelectric conversion unit and an amplification transistor for amplifying and outputting a signal of the photoelectric conversion unit are two-dimensionally arranged in horizontal and vertical directions, and in that a power supply wiring, which extends in a vertical direction along pixel boundaries of horizontal and vertical directions while meandering, is arranged on one of two pixel lines adjoining to each other in the horizontal direction in the pixel area, and the power supply wiring is connected to one of a source and a drain of the amplification transistor on each of the two pixel lines.

Further, a solid-state image pickup apparatus according to the present invention is characterized by comprising a pixel area in which unit cells each having at least plural photoelectric conversion units adjoining in a vertical direction and a common amplification transistor for amplifying and outputting respective signals of the plural photoelectric conversion units are two-dimensionally arranged in horizontal and vertical directions, and in which the unit cell is composed of plural pixels each including the photoelectric conversion unit, and in that a power supply wiring, which extends in a vertical direction along pixel boundaries of horizontal and vertical directions while meandering, is arranged on one of two pixel lines adjoining to each other in the horizontal direction in the pixel area, and the power supply wiring is connected to one of a source and a drain of each of the amplification transistors respectively provided for both of the two pixel lines.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate the embodiments of the present invention and, together with the description, serve to explain the principles of the present invention.

BEST MODE FOR CARRYING OUT THE INVENTION

Hereinafter, the exemplary embodiments of the present invention will be described with reference to the attached drawings.

First Embodiment

Figure 2:
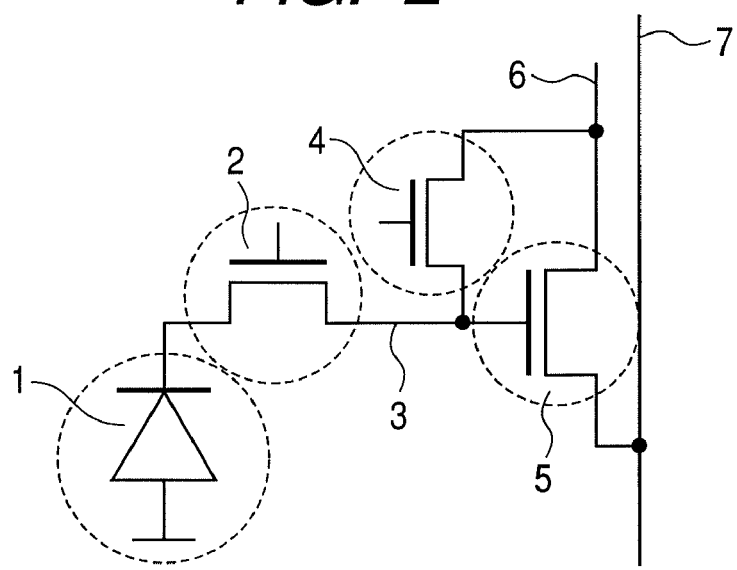
FIG. 2 is a diagram illustrating an equivalent circuit of the pixel for describing the first embodiment of the present invention.

FIG. 2 is a diagram illustrating an example of an equivalent circuit of one pixel of an amplified solid-state image pickup apparatus. In FIG. 2, a photodiode 1 acts as a photoelectric conversion unit, a transfer MOS (metal oxide semiconductor) transistor 2 is used to transfer the signal charges accumulated in the photodiode 1, and an FD (floating fusion) 3 which is used to receive the signals transferred through the transfer MOS transistor 2. Further, a reset MOS transistor 4 is used to reset the FD 3, and an amplification MOS transistor 5 of which the gate is connected to the FD 3 is used to amplify and read the signals of the photoelectric conversion unit. Besides, a power supply wiring 6 which also acts as a reset potential supplying wiring is commonly connected to the drain of the reset MOS transistor 4 and the drain of the amplification MOS transistor 5, and a pixel output wiring 7 is connected to the source of the amplification MOS transistor 5.

Here, it should be noted that the power supply wiring 6, which functions to supply reset potential, can switchably supply non-selection potential (non-selection) to the FD 3 of the pixel of the line from which signal reading is not performed and potential which is used to reset the FD 3 of the pixel of the line from which signal reading is performed and is used in a case where the amplification MOS transistor 5 performs a signal amplification operation.

Figure 3:
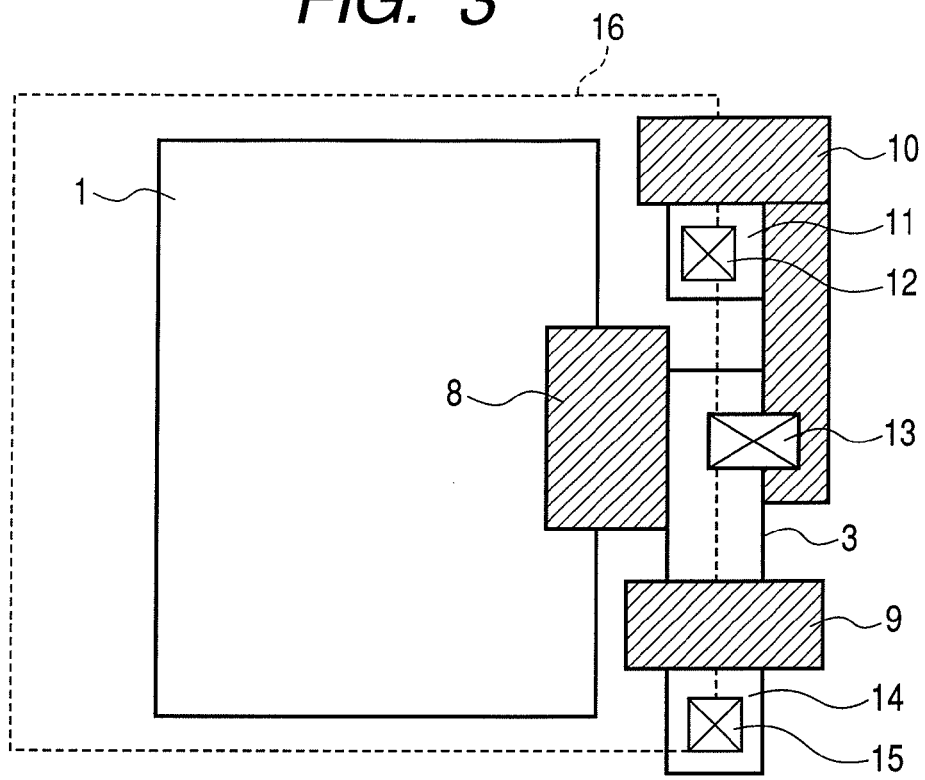
FIG. 3 is a diagram illustrating a layout of the pixel for describing the first embodiment of the present invention.

FIG. 3 is a diagram illustrating a plane layout of the pixel having the equivalent circuit illustrated in FIG. 2, from which the wiring layer has been eliminated. Here, it should be noted that the pixels each of which has the layout of this type are repetitively arranged in the horizontal direction and the vertical direction. More specifically, FIG. 3 illustrates a gate electrode 8 of the transfer MOS transistor 2, a gate electrode 9 of the reset MOS transistor 4, a gate electrode 10 of the amplification MOS transistor 5, and a source 11 (acting as a source region) of the amplification MOS transistor 5. Further, FIG. 3 illustrates a contact hole 12 which is used to connect the source 11 and the pixel output wiring 7, and a contact hole 13 which is used to connect the FD 3 and the gate electrode 10. Here, it should be noted that an electric conductor has been filled in each contact hole to electrically connect a semiconductor region such as a source region or a drain region or the gate electrode to the upper wiring layer. Furthermore, FIG. 3 illustrates a drain 14 (acting as a drain region) which is commonly used for the reset MOS transistor 4 and the amplification MOS transistor 5. Incidentally, it should be noted that the drain 14 acts as the drain which is commonly used for the drain of the reset MOS transistor 4 of one pixel and the drain of the amplification MOS transistor 5 of another adjoining pixel. Here, the drain 14 may be formed by a common diffusion region. Alternatively, the drain 14 may be formed by independently forming different diffusion regions and then electrically connecting the formed different diffusion regions by a wiring layer.

Further, FIG. 3 illustrates a contact hole 15 in which an electric conductor to be used to connect the drain 14 and the power supply wiring 6 has been filled, and a unit pixel frame 16 (indicating a region of one pixel). Here, it should be noted that the center of the photodiode 1 and the center of the unit pixel frame 16 coincide with each other.

Although FIG. 3 does not specifically illustrate, there are further provided the driving wiring of the gate electrode 8 of the transfer MOS transistor 2, the driving wiring of the gate electrode 9 of the reset MOS transistor 4, and the contact holes in which electric conductor for respectively connecting the gate electrodes 8 and 9 to their driving wirings have been filled. Here, it should be noted that the driving wirings of the gate electrodes 8 and 9 respectively extend in the horizontal direction.

Figure 1:
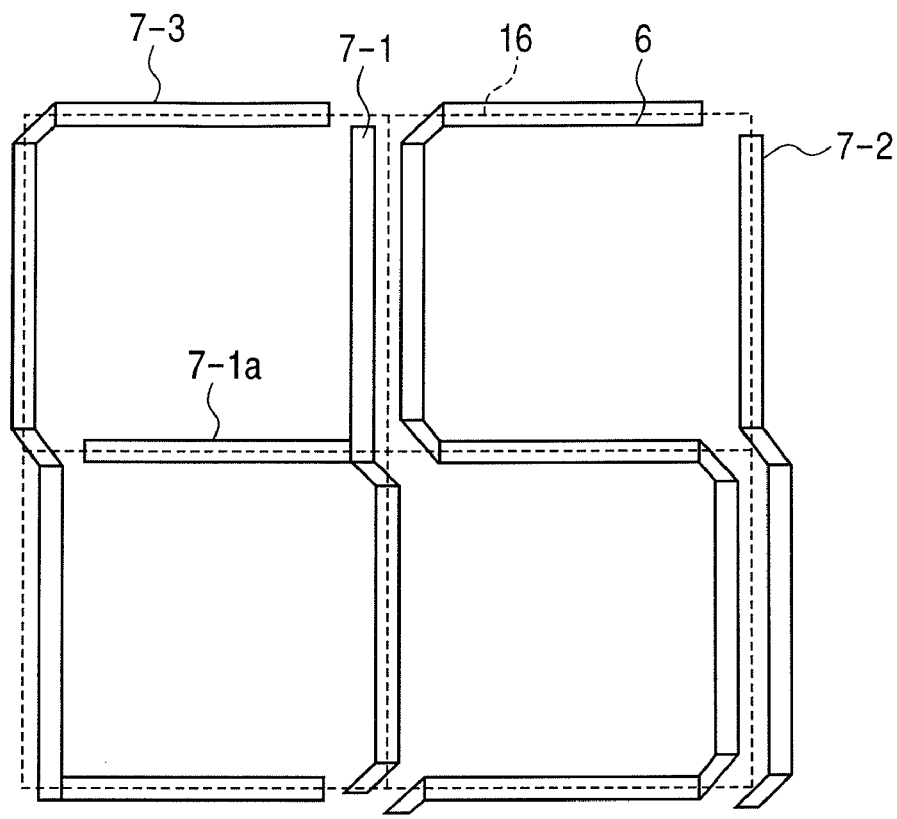
FIG. 1 is a diagram illustrating a wiring layout of pixels for describing an embodiment of the present invention.
Figure 6:
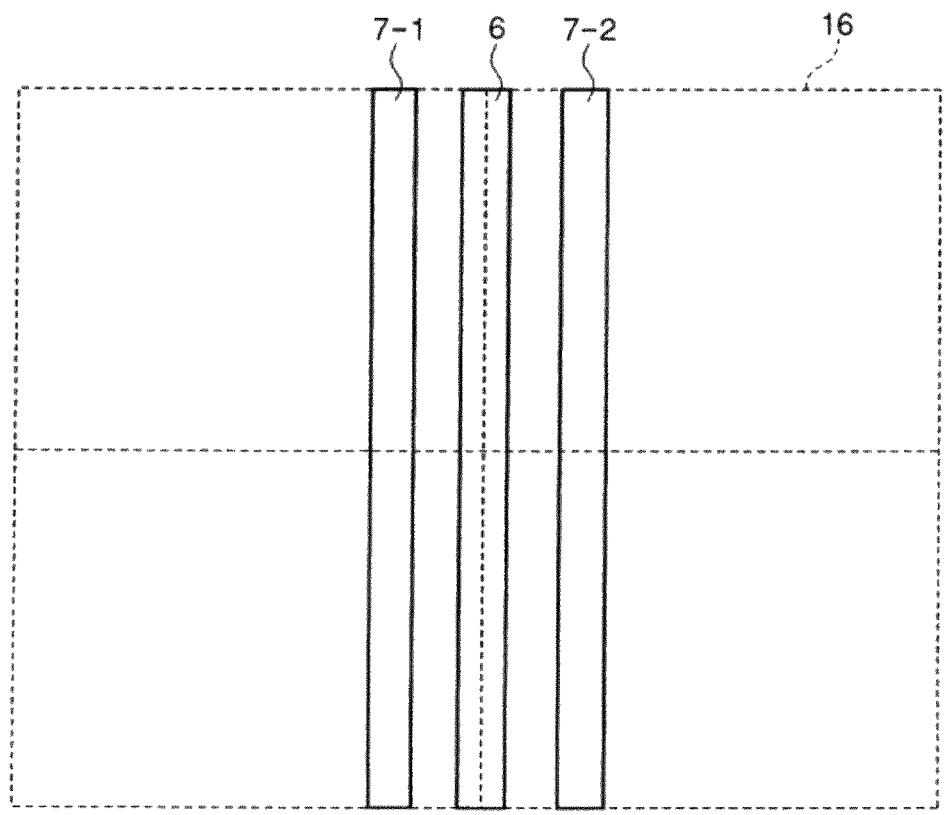
FIG. 6 is a diagram illustrating a pixel wiring layout according to the related background art.

FIG. 1 is a diagram illustrating a plane layout of the power supply wirings and the pixel output wirings of a 2×2 pixel arrangement. It should be noted that this diagram most surely depicts the constitution of the present embodiment. Here, although FIG. 1 indicates a case where the 2×2 pixels are arranged in the horizontal and vertical directions, a pixel area may be constituted by arranging an arbitrary number of pixels in the horizontal and vertical directions. As well as FIG. 6, FIG. 1 illustrates a power supply wiring 6 (acting as wirings for supplying power) which is common to two pixel lines, a left-line pixel output wiring 7-1 of the two pixel lines, and a right-line pixel output wiring 7-2 of the two pixel lines. Further, FIG. 1 illustrates a pixel output wiring 7-3 of the line positioned at the left of the illustrated two pixel lines.

Here, it should be noted that the illustrated parts which are common to FIGS. 1, 2 and 3 are indicated by the same numbers respectively, and redundant explanations thereof are omitted. Further, it should be noted that the driving wiring layer extending in the horizontal direction is formed by a first layer which is lower in regard to the surface of a semiconductor, and that the layer of the power supply wiring and the pixel output wiring extending in the vertical direction is formed by a second same layer which is higher than the first layer. In any case, the driving wirings of the first layer include the driving wiring of the gate electrode 8 and the driving wiring of the gate electrode 9 of the reset MOS transistor 4.

The pixel output wirings 7-1 and 7-2 and the power supply wiring 6 are respectively electrically connected with each other through the electric conductors filled in the contact holes 12 and 15, a local connection wiring to be formed by the first layer and an electric conductor filled in a through-hole used for connecting the first layer with the second layer. For this reason, the pixel output wirings 7-1 and 7-2 and the power supply wiring 6 illustrated in FIG. 1 are not required to be arranged on just above the contact holes 12 and 15, and these wirings can be electrically connected if these wirings are positioned in the vicinity of the contact holes 12 and 15. This is because that connections of the wirings can be adjusted by a position of the first layer wiring to be served as the local connection wiring and a position of the through-hole used for connecting the first layer with the second layer if within a range of not intruded by the driving wiring to be formed by the first layer. In the present embodiment, the contact hole 12 is positioned on a right side of the pixel frame 16 and the contact hole 15 is positioned on a lower right corner of the pixel frame 16 as illustrated in FIG. 3.

On the other hand, the pixel output wirings 7-1 and 7-2 extend in a vertical direction along right sides of respective pixel lines, and the power supply wiring 6 extends in a vertical direction along horizontal and vertical pixel boundaries of the right pixel line while meandering in a zigzag state as illustrated in FIG. 1. Therefore, the contact holes 12 and 15 of either pixel can be also arranged in the vicinity of the wirings to be connected. The power supply wiring 6 is connected to one of drains of respective amplification transistors provided on both of two pixel lines. A dummy wiring 7-1a branched from the pixel output wiring 7-1 similar to that of a right pixel line is extended on a pixel boundary of a horizontal direction of a left pixel line on which the power supply wiring 6 is not arranged. According to this arrangement, a layout form of a second wiring layer on the pixel boundary of a horizontal direction can be conformed in the right and left pixel lines.

Since the pixel structure of the present embodiment is to have one power supply wiring for two pixel lines, a wiring opening can be widened, and the sensitivity can be improved. In addition, since a layout form of oblique adjoining pixels is almost a translational symmetry in both semiconductor device portions and wiring portions, the output shifting in same color pixels can be suppressed for a color filter arrangement, in which oblique adjoining pixels have the same color, such as the Bayer-arrangement. As to a form of a second wiring layer of right and left or above and below adjoining pixels, that form does not have a translational symmetric property, but that form is in a state of a mirror symmetry for the pixel boundary of a vertical direction. Since right and left or above and below adjoining pixels are in the different color relationship, the hue is more blurred closer to right and left ends of a pixel area as compared with a center of the pixel area. However, a form of a semiconductor element maintains a translational symmetry between the right and left or above and below adjoining pixels, and influencing degree of the color signal shifting for image quality is smaller as compared with the luminance signal shifting.

On the other hand, in case of performing an interlacing operation for a three chips camera without using a color filter, a centroid of an added signal of the above and below adjoining pixels coincides with a center of the pixel, and the output shifting in right and left adjoining columns can be suppressed. Therefore, according to the present embodiment, a solid-state image pickup apparatus excellent in sensitivity and image quality can be provided.

As described above, in the present embodiment, a form of a semiconductor device used for constituting each pixel such as a photoelectric conversion unit, an amplification transistor or the like can be arranged while maintaining a translational symmetric property in the amplified solid-state image pickup apparatus having a pixel area where pixels are two-dimensionally arranged in horizontal and vertical directions. A power supply wiring of a transistor used for amplifying a signal is constituted in a zigzag form along horizontal and vertical boundaries of pixels every other column in the pixel arrangement. A dummy wiring having the same layer as that of a power supply wiring layer is arranged on a horizontal pixel boundary of a column on which the power supply wiring is not arranged, and a wiring form can be constituted in such a state that 2×2 pixels act as one unit. Accordingly, since the translational symmetric property of the same color pixels can be maintained each other, a wiring opening can be widened while suppressing the output shifting of adjoining columns in a luminance signal output value, and an image pickup apparatus excellent in sensitivity and image quality can be provided.

Second Embodiment

Figure 4:
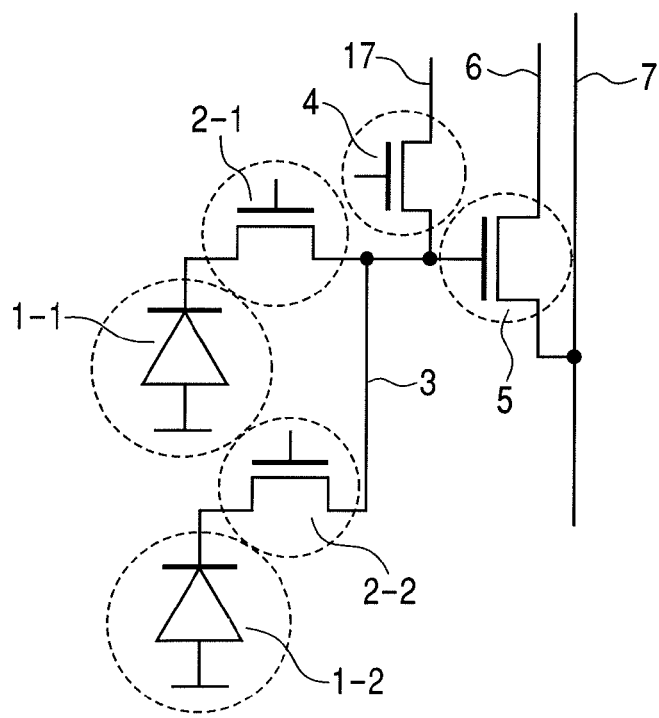
FIG. 4 is a diagram illustrating an equivalent circuit of the pixel for describing the second embodiment of the present invention.

FIG. 4 is a diagram illustrating an equivalent circuit constituted that image signals of at least two photoelectric conversion units are amplified by a common amplification MOS transistor. This method is widely applied especially to a small size pixel. More specifically, FIG. 4 illustrates photodiodes 1-1 and 1-2 for respective two pixels and transfer MOS transistors 2-1 and 2-2 used for transferring signals of the respective photodiodes 1-1 and 1-2 to an FD3. A drain 17 is included in a reset MOS transistor 4 to which the reset potential is supplied. A pixel frame 16 (FIG. 5) of two pixels adjoining in a vertical direction indicates a unit cell frame (indicate area of a unit cell). One pixel includes the photodiode and a part of an amplification transistor.

A reset potential supply wiring serves as a power supply wiring and further may serve as a pixel output wiring. In addition, it may be provided as a reset wiring independent from the power supply wiring and the pixel output wiring. The present embodiment can be applied to any case. In FIG. 4, members common to those in FIG. 2 are denoted by the same reference numerals and description thereof will be omitted.

Figure 5:
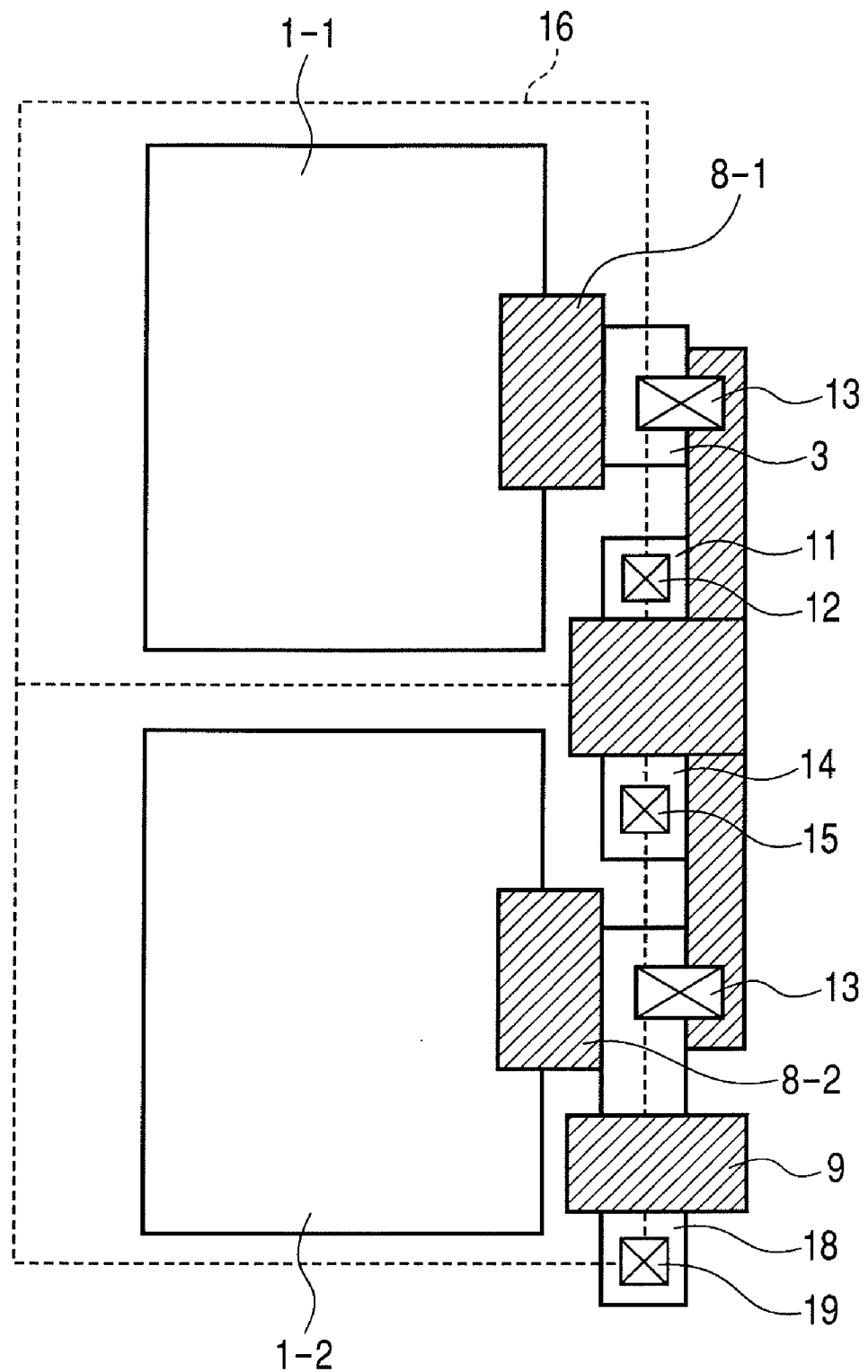
FIG. 5 is a diagram illustrating a layout of the pixels for describing the second embodiment of the present invention.

FIG. 5 is a diagram illustrating a plane layout of semiconductor devices excepting wiring layers of pixels having the equivalent circuit illustrated in FIG. 4. Unit cells are repeatedly arranged in horizontal and vertical directions with this layout. More specifically, FIG. 5 illustrates gate electrodes 8-1 and 8-2 respectively included in the transfer MOS transistors 2-1 and 2-2, a drain 18 (acting as a drain area) included in the reset MOS transistor 4 and a contact hole 19, where an electric conductor is filled, used for connecting the drain 18 with the reset potential supply wiring.

The present embodiment corresponds to a case that a wiring layout illustrated in FIG. 1 was applied to the pixels having the constitutions as in FIGS. 4 and 5. The structure that a pixel driving wiring which extends in a horizontal direction is formed by a first layer and the power supply wiring and the pixel output wiring are formed by a second layer is same as that of the first embodiment. However, a wiring form that the power supply wiring is made to be meandered every one pixel illustrated in FIG. 1 is not adopted, but a wiring form that the power supply wiring is made to be meandered every one unit cell (two pixels) is adopted. That is, in the present embodiment, this is because that the power supply wiring is not made to be meandered every one pixel since the amplification transistor is provided every two pixels which are adjoining in a vertical direction.

As for the drain 18 to which the reset potential is supplied, since this drain positions on a corner of the pixel frame 16, the drain approaches either of the power supply wiring and the pixel output wiring illustrated in FIG. 1 or is arranged just under these wirings. Therefore, either the power supply wiring or the pixel output wiring can be used as the reset potential supply wiring. In a case that the reset potential supply wiring exists independent from these wirings, since the reset potential supply wiring is formed by the first layer, it becomes to be formed such a wiring which extends to a horizontal direction.

Next, as for the connection with the power supply wiring and a drain 14 of the amplification MOS transistor, a drain 14 on a right column positions in the vicinity of a power supply wiring 6 having a zigzag form as apparent from a case of overlapping a layout of 2×2 pixels obtained by laterally arranging two layouts, of which the one layout is illustrated in FIG. 5, with a wiring layout illustrated in FIG. 1. Therefore, the connection with the drain 14 on the right column and the power supply wiring 6 can be easily realized similar to a case in the first embodiment. Although a drain 14 on a left column is slightly distanced from the power supply wiring 6 illustrated in FIG. 1 each other, the drain 14 can be connected with the power supply wiring 6 by extending a local connection wiring formed by the first layer to be connected with a contact hole 15 on the left column to a position just under the power supply wiring 6.

In addition, positions of a source and a drain of an amplification MOS transistor 5 on the left column are reversed to positions of a source and a drain on a right column, and a source 11 can be also connected to the power supply wiring as a drain and the drain 14 can be also connected to the pixel output wiring as a source with regard to the left column. That is, the source and the drain of a common amplification transistor can be arranged on such positions where the source and the drain are replaced in the two-column pixels themselves. In this manner, a first layer wiring to be connected to the drain is not required in extending only the one side column, and the pixel structure having a wide wiring opening which maintains a layout-translational symmetric property of the oblique adjoining pixels can be realized.

In a case that oblique adjoining pixels have the same color filter, a fact that it is effective to apply the present embodiment to a case of performing an interlacing operation without the color filter is similar to a fact in the first embodiment. Therefore, according to the present embodiment, a solid-state image pickup apparatus excellent in sensitivity and image quality can be provided. The present embodiment is effective especially to a small size pixel.

As mentioned above, although the two embodiments have been described, an application of the present invention is not always limited to the pixel constitution of the above-mentioned embodiments. Besides the charge-coupled device (CCD), the present invention can be applied to a solid-state image pickup apparatus constituted from pixels having an amplification transistor and a power supply wiring of that amplification transistor without limiting to a MOS transistor.

In addition, if a wiring used for supplying the power is not arranged on the pixel boundary, it is allowed to be provided with a state of offsetting to horizontal or vertical direction from the pixel boundary. It is allowed to be arranged along the pixel boundary.

Even if the pixel is based on a method of connecting a photodiode with a control electrode of the amplification transistor without including the transfer MOS transistor, the present invention can be applied. In the pixel constitution where plural transfer MOS transistors join with a control electrode of one common amplification transistor, even if the number of common pixels is equal to or larger than three instead of two as in the above-mentioned second embodiment, of course, the present invention can be applied. In the common constitution of pixels arranging in a horizontal direction, there are problems that pixels for one row have to be read out by dividing a reading operation into plural processes and the translational symmetric property of the common pixels are degraded each other. However, when the present invention is applied to the common constitution of pixels arranging in a vertical direction, since a wiring opening can be widened without having these problems, it is very effective to improve image quality.

It is also considered that the constitution of the present invention is applied to at least a part of a pixel area. For example, as for a power supply wiring of an optical black, the present invention can be also applied to only an opening area with a state of one wiring per one column.

Furthermore, a dummy wiring formed by the second layer laid down on the pixel boundary of a horizontal direction in a column on which the power supply wiring is not arranged is not always branched from the pixel output wiring. The dummy wiring may be formed by switching to a second wiring from a wiring of another first layer via a through-hole. The dummy wiring is not always connected with the pixel output wiring or another wiring but may be separated from the pixel output wiring or another wiring.

According to the present embodiment, even if the size of a pixel is small, an amplified solid-state image pickup apparatus excellent in image quality can be provided.

Third Embodiment

Hereinafter, it will be described as to a camera which uses the solid-state image pickup apparatus described in the first and second embodiments with reference to FIG. 7.

Figure 7:
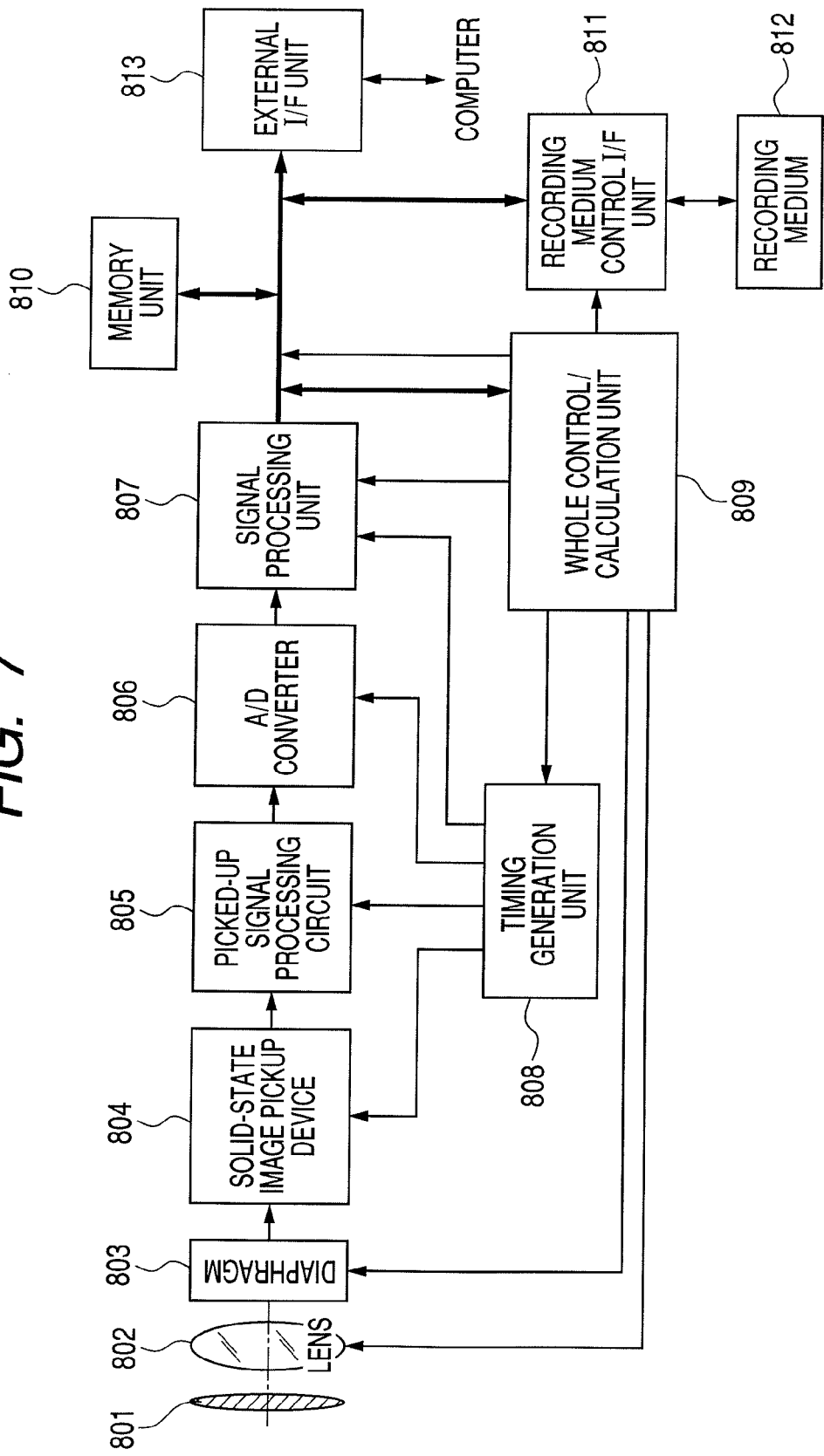
FIG. 7 is a block diagram illustrating a camera which uses a solid-state image pickup apparatus according to the present invention.

In FIG. 7, a barrier 801 serves as a protecting function of a lens and a main switch, a lens 802 (acting as an optical system) images an optical image of a photographic subject on a solid-state image pickup device 804 (acting as a solid-state image pickup apparatus) and a diaphragm 803 is used to variably control amount of the light emitted through from the lens 802. The image pickup device 804 is used to pick up (capture) the optical image of the photographic subject imaged by the lens 802 as image signals. A picked-up signal processing circuit 805 includes a gain variable amplifier unit for amplifying an image signal to be output from the solid-state image pickup device 804 and a gain correction circuit unit used for correcting a gain value. An A/D converter 806 performs an analog-digital conversion of the image signal to be output from the solid-state image pickup device 804 and a signal processing unit 807 performs various corrections to image data which was output from the A/D converter 806 or compresses data. A timing generation unit 808 outputs various timing signals to the image pickup device 804, the picked-up signal processing circuit 805, the A/D converter 806 and the signal processing unit 807. A whole control/calculation unit 809 performs various calculations and controls the whole of a still video camera, a memory unit 810 is used for temporarily storing image data and a recording medium control I/F unit 811 is used for recording image data to a recording medium and reading out the image data from the recording medium. A detachable recording medium 812 such as a semiconductor memory is used for recording or reading out the image data and an I/F unit 813 is used for communicating with an external computer or the like.

INDUSTRIAL APPLICABILITY

The solid-state image pickup apparatus according to the present invention can be used in general information equipment which uses an amplified solid-state image pickup apparatus. In particular, this apparatus can be used in various cameras such as a digital still camera, digital video camera, a TV (television) camera, a Web camera, and the like.

As described above, according to the present invention, the amplified solid-state image pickup apparatus of which the sensitivity is high, in which a difference of the sensitivities at one-line intervals is small, and which can generate high-quality images can be provided.

While the present invention has been described with reference to the exemplary embodiments, it is to be understood that the present invention is not limited to the disclosed embodiments because these embodiments merely indicate examples of concretization in case of carrying out the present invention. That is, many apparently widely different embodiments of the present invention can be made without departing from the spirit and scope thereof.

This application claims the benefit of Japanese Patent Application No. 2008-049897, filed Feb. 29, 2008, which is hereby incorporated by reference herein in its entirety.

The invention claimed is:

1. A solid-state image pickup apparatus, comprising:
   a plurality of pixels which comprise a pixel area, each of the pixels including at least:
      a photoelectric conversion unit, and
      an amplification transistor for amplifying and outputting a signal generated by the photoelectric conversion unit,
   wherein the pixels are arranged two-dimensionally in a first and a second direction; and
   a power supply wiring, which extends in the first direction and is arranged so as to supply a predetermined voltage to sources or drains of amplification transistors of a plurality of pixels which form a first pixel line,
   wherein the power supply wiring is comprised of a plurality of portions, including:
      (i) a first portion arranged on a side of a second pixel line that is adjacent to the first pixel line and which extends in the first direction,
      (ii) a second portion arranged on a side of a third pixel line that is adjacent to a side of the first pixel line, opposite to the second pixel line, and which extends in the first direction, and
      (iii) a third portion arranged across the first pixel line and electrically connecting the first portion and the second portion to each other,
   wherein each of the first, second, and third pixel lines include an output line from which a signal is outputted, and
   wherein the power supply wiring is electrically connected to (i) the sources or the drains of the amplification transistors of the plurality of pixels included in the first pixel line, and (ii) sources or drains of amplification transistors of a plurality of pixels included in the second pixel line.

2. A solid-state image pickup apparatus according to claim 1, wherein the pixel area is driven by an interlace operation.

3. A camera comprising:
   a state image pickup apparatus according to claim 1; and
   an optical system which performs imaging on the solid-state image pickup apparatus.

4. A solid-state image pickup apparatus, comprising:
   a plurality of unit cells which comprise a pixel area, each of the unit cells including at least:
      a plurality of photoelectric conversion units adjoining in a first direction, and
      a common amplification transistor for amplifying and outputting respective signals generated by the plurality of photoelectric conversion units,
   wherein the unit cells are arranged two-dimensionally in the first direction and a second direction, and
   wherein each unit cell is comprised of a plurality of pixels, each of which include one of the plurality of photoelectric conversion units;
   a power supply wiring, which extends in the first direction and is arranged so as to supply a predetermined voltage to sources or drains of common amplification transistors of unit cells which form a first pixel line, wherein the power supply wiring is comprised of a plurality of portions, including:
- (i) a first portion arranged on a side of a second pixel line that is adjacent to the first pixel line and which extends in the first direction,
- (ii) a second portion arranged on a side of a third pixel line that is adjacent to a side of the first pixel line, opposite to the second pixel line, and which extends in the first direction, and
- (iii) a third portion arranged across the first pixel line and electrically connecting the first portion and the second portion to each other, wherein each of the first, second, and third pixel lines include an output line from which a signal is outputted, and wherein the power supply wiring is electrically connected to (i) the sources or the drains of the common amplification transistors of the plurality of unit cells included in the first pixel line, and (ii) sources or drains of common amplification transistors of a plurality of unit cells included in the second pixel line.

5. A solid-state image pickup apparatus according to claim 4, wherein the pixel area is driven by an interlace operation.

6. A camera comprising:
a state image pickup apparatus according to claim 4; and
an optical system which performs imaging on the solid-state image pickup apparatus.

7. A solid-state image pickup apparatus, comprising:
a pixel area in which a plurality of unit cells, each having at least plural photoelectric conversion units adjoining in a vertical direction and a common amplification transistor for amplifying and outputting respective signals generated by the plural photoelectric conversion units, are two-dimensionally arranged in horizontal and vertical directions, wherein the unit cell is composed of a plurality of pixels each including one of the photoelectric conversion units; and a power supply wiring, which extends in the vertical direction while meandering along pixel boundaries in the horizontal and vertical directions, arranged on one of two pixel lines adjoining to each other in the horizontal direction in the pixel area, and wherein the power supply wiring is connected to one of a source and a drain of each of the common amplification transistors respectively provided for both of the two pixel lines, and wherein positions of a source and a drain of a common amplification transistor on one of the two pixel lines are reversed from positions of a source and a drain of a common amplifications transistor on an other of the two pixel lines.

8. A solid-state image pickup apparatus, comprising:
a pixel area in which a plurality of pixels, each having at least a photoelectric conversion unit and an amplification transistor for amplifying and outputting a signal generated by the photoelectric conversion unit, are two-dimensionally arranged in horizontal and vertical directions; and a power supply wiring, which extends in the vertical direction while meandering along pixel boundaries in the horizontal and vertical directions, is arranged on one of two pixel lines adjoining to each other in the horizontal direction in the pixel area, and wherein the power supply wiring is connected to one of a source and a drain of the amplification transistors on each of the two pixel lines; and a pixel output wiring which is electrically connected to one of a source or a drain of each the amplification transistors, whichever is not connected to the power supply wiring, on each pixel line in the pixel area and is provided for each pixel line.

9. A solid-state image pickup apparatus according to claim 8, wherein a dummy wiring, which is formed by a same layer as that of the pixel output wiring, is arranged on a pixel boundary in the horizontal direction on one of the two pixel lines to which the power supply wiring is not arranged.

10. A solid-state image pickup apparatus, comprising:
a pixel area in which a plurality of unit cells, each having at least plural photoelectric conversion units adjoining in a vertical direction and a common amplification transistor for amplifying and outputting respective signals generated by the plural photoelectric conversion units, are two-dimensionally arranged in horizontal and vertical directions, wherein the unit cell is composed of a plurality of pixels each including one of the photoelectric conversion units;

a power supply wiring, which extends in the vertical direction while meandering along pixel boundaries in the horizontal and vertical directions, arranged on one of two pixel lines adjoining to each other in the horizontal direction in the pixel area, and wherein the power supply wiring is connected to one of a source and a drain of each of the common amplification transistors respectively provided for both of the two pixel lines; and a pixel output wiring which is electrically connected to one of a source and a drain of each of the common amplification transistors, whichever is not connected to the power supply wiring, on each pixel line in the pixel area and is provided for each pixel line.

11. A solid-state image pickup apparatus according to claim 10, wherein a dummy wiring, which is formed by a same layer as that of the pixel output wiring, is arranged on a pixel boundary in the horizontal direction on one of the two pixel lines to which the power supply wiring is not arranged.

12. A solid-state image pickup apparatus, comprising:
a pixel area in which a plurality of pixels, each having at least a photoelectric conversion unit and an amplification transistor for amplifying and outputting a signal generated by the photoelectric conversion unit, are two-dimensionally arranged in horizontal and vertical directions; and a power supply wiring, which extends in the vertical direction while meandering along pixel boundaries in the horizontal and vertical directions, is arranged on one of two pixel lines adjoining to each other in the horizontal direction in the pixel area, and wherein the power supply wiring is connected to one of a source and a drain of the amplification transistors on each of the two pixel lines, and wherein the pixel area includes a color filter which has an arrangement such that oblique adjoining pixels have a same color.

13. A solid-state image pickup apparatus, comprising:
a pixel area in which a plurality of unit cells, each having at least plural photoelectric conversion units adjoining in a vertical direction and a common amplification transistor for amplifying and outputting respective signals generated by the plural photoelectric conversion units, are two-dimensionally arranged in horizontal and vertical directions, wherein the unit cell is composed of a plurality of pixels each including one of the photoelectric conversion units; and a power supply wiring, which extends in the vertical direction while meandering along pixel boundaries in the horizontal and vertical directions, is arranged on one of two pixel lines adjoining to each other in the horizontal direction in the pixel area, and wherein the power supply wiring is connected to one of a source and a drain of each of the common amplification transistors respectively provided for both of the two pixel lines, wherein the pixel area includes a color filter which has an arrangement such that oblique adjoining pixels have a same color.

* * * * *